United States Patent
Zhidkow

(10) Patent No.: US 8,458,569 B2
(45) Date of Patent: Jun. 4, 2013

(54) APPARATUS AND METHOD FOR IMPROVING ERROR CORRECTION CAPABILITY USING STUFFING BYTE

(75) Inventor: Sergey Zhidkow, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 368 days.

(21) Appl. No.: 12/959,725

(22) Filed: Dec. 3, 2010

(65) Prior Publication Data
US 2011/0129044 A1 Jun. 2, 2011

Related U.S. Application Data

(62) Division of application No. 11/613,705, filed on Dec. 20, 2006.

(30) Foreign Application Priority Data

Jun. 27, 2006 (KR) .................. 10-2006-0057782

(51) Int. Cl.
*H03M 13/00* (2006.01)

(52) U.S. Cl.
USPC ........................ 714/774; 714/780; 714/755

(58) Field of Classification Search
USPC ......................... 714/774, 780, 755
See application file for complete search history.

(56) References Cited

U.S. PATENT DOCUMENTS

| | | | | | |
|---|---|---|---|---|---|
| 4,336,612 | A | * | 6/1982 | Inoue et al. | 714/755 |
| 5,686,965 | A | * | 11/1997 | Auld | 375/240.01 |
| 5,996,103 | A | * | 11/1999 | Jahanghir | 714/755 |
| 6,029,264 | A | * | 2/2000 | Kobayashi et al. | 714/755 |
| 6,522,694 | B1 | * | 2/2003 | Ryan | 375/240.25 |
| 6,825,782 | B2 | * | 11/2004 | Bossen | 341/107 |
| 6,850,175 | B1 | * | 2/2005 | Bossen | 341/107 |
| 6,906,647 | B2 | * | 6/2005 | Bossen | 341/107 |
| 6,967,601 | B2 | * | 11/2005 | Bossen | 341/107 |
| 7,183,951 | B2 | * | 2/2007 | Bossen | 341/107 |
| 7,236,687 | B2 | * | 6/2007 | Kato et al. | 386/95 |

* cited by examiner

*Primary Examiner* — Joseph D Torres
(74) *Attorney, Agent, or Firm* — F. Chau & Associates, LLC

(57) ABSTRACT

A decoding circuit and method for improving error correction capability using a stuffing byte, in which in the decoding method, an input data packet is decoded. When it is determined that error correction is impossible based on a decoding result, a stuffing byte section is detected in the input data packet. A level value of data in the stuffing byte section is converted into a stuffing byte level value. A data packet having the converted level value is decoded and output. The decoding circuit includes a decoder decoding an input data packet and a control block detecting a stuffing byte section in the input data packet, converting the input data packet, and decoding a converted data packet when the decoder fails in error correction of the input data packet.

7 Claims, 10 Drawing Sheets

US 8,458,569 B2

APPARATUS AND METHOD FOR IMPROVING ERROR CORRECTION CAPABILITY USING STUFFING BYTE

CROSS-REFERENCE TO RELATED APPLICATIONS

This application is a Divisional of U.S. Application Ser. No. 11/613,705 filed on Dec. 20, 2006, which claims priority to Korean Patent Application No. 10-2006-0057782, filed on Jun. 27, 2006, in the Korean Intellectual Property Office, the disclosures of which are incorporated by reference herein in their entireties.

BACKGROUND OF THE INVENTION

1. Technical Field

The present disclosure relates to a decoding circuit and, more particularly, to a decoding circuit and method for improving error correction capability in a terrestrial digital multimedia broadcasting (T-DMB) system, and a recording medium for recording the method.

2. Discussion of the Related Art

A T-DMB system is a standard for broadcasting systems providing multimedia broadcasting services including high-quality audio, video and data services. The T-DMB system uses Moving Picture Experts Group standard-4 (MPEG-4) Advanced Video Coding (AVC) and MPEG-4 Bit Sliced Arithmetic Coding (BSAC) to provide high-quality audio, video or data signals at a low bandwidth of less than 512 kbps.

FIG. 1 illustrates a block diagram of a conventional T-DMB system. Referring to FIG. 1, the conventional T-DMB system 10 includes a transmission unit 20, a channel 30, and a receiving unit 40. The transmission unit 20 includes an MPEG-4 encoder 21, a multiplexer 23, a Reed-Solomon (RS) encoder 25, an interleaver 27, a convolutional encoder 28, and a modulator 29.

The MPEG-4 encoder 21 codes a source signal, for example, a video signal, an audio signal, or a data signal at high efficiency and packetizes the encoded source signal, for example, a video stream, an audio stream, or a data stream. The multiplexer 23 encapsulates streams packetized by the MPEG-4 encoder 21 in a standard. MPEG transport stream.

The RS encoder 25 codes the standard MPEG transport stream output from the multiplexer 23. In other words, the RS encoder 25 converts the standard MPEG transport stream into an RS code. The interleaver 27 interleaves the coded standard MPEG transport stream output from the RS encoder 25.

The convolutional encoder 28 performs trellis coding of the interleaved standard MPEG transport stream. The modulator 29 modulates, for example, performs orthogonal frequency division multiplexing (OFDM) modulation of, the trellis coded standard MPEG transport stream output from the convolutional encoder 28 and transmits the modulated standard MPEG transport stream to the receiving unit 40 via the channel 30.

The receiving unit 40 includes a demodulator 41, a Viterbi decoder 43, a deinterleaver 45, an RS decoder 47, a demultiplexer 48, and an MPEG-4 decoder 49.

The demodulator 41 demodulates a signal Dq received via the channel 30. The Viterbi decoder 43 decodes the demodulated signal output from the demodulator 41. The deinterleaver 45 deinterleaves the decoded signal output from the Viterbi decoder 43. The RS decoder 47 decodes a deinterleaved signal Dp output from the deinterleaver 45 and outputs a decoded signal Dq.

The demultiplexer 48 divides the decoded signal Dq output from the RS decoder 47 into a video stream, an audio stream, and a data stream. The MPEG-4 decoder 49 performs MPEG decoding of the streams, for example, a video stream, an audio stream, and a data stream, output from the demultiplexer 48.

FIG. 2 illustrates a conventional RS codeword. Referring to FIGS. 1 and 2, the RS codeword includes data 210 and a parity byte 220. The RS codeword is "n" bytes in length. The data 210 is "k" bytes in length and the parity byte 220 is $2t$ ($=n-k$) bytes in length. When a RS codeword output from the RS encoder 25 is the same as the RS codeword illustrated in FIG. 2, the RS decoder 47 can correct "t" error bytes existing in the RS codeword. Here, "n", "k", and "t" are natural numbers.

For example, the RS decoder 47 can correct a maximum of 8 byte errors with respect to a RS codeword (e.g., n=204, k=188, t=8). Here, the RS decoder 47 has an error correction capability of 8 bytes.

When errors detected by the RS decoder 47 exceed the error correction capability, for example, 8 bytes, however, the RS decoder 47 fails in error correction. When the RS decoder 47 fails in error correction, the demultiplexer 48 will not demultiplex the RS codeword.

An encoded MPEG transport stream output from the RS encoder 25 includes at least one stuffing byte. In the T-DMB system 10, about 20 to 25 percent of all MPEG packets in a transport stream may include continuous stuffing bytes. These stuffing bytes are redundant information, needed to align a variable-rate stream produced by the RS encoder with the constant 25 throughput provided by the communication link. Usually, a stuffing byte value has a hexadecimal format of 0x0FF. Here, a section in which the stuffing bytes exist in an MPEG packet is referred to as the "stuffing byte section".

FIG. 3A illustrates an example of an MPEG packet that does not include stuffing bytes. FIGS. 3B and 3C illustrate examples of MPEG packets including stuffing bytes. With respect to a source like fast-moving video having a large amount of information, an MPEG packet does not include stuffing bytes, as illustrated in FIG. 3A.

With respect to a source like slow-moving video having a small amount of information, however, an MPEG packet includes at least one stuffing byte, as illustrated in FIGS. 3B and 3C. In FIGS. 3A through 3C, the horizontal axis is a byte index and the vertical axis is a byte value. The amount of stuffing bytes in packets of a transport stream is inversely proportional to the amount of information in a source in a T-DMB system.

The MPEG transport stream including MPEG packets having stuffing bytes is converted into an RS codeword by the RS encoder 25. When the number of errors existing in the RS codeword exceeds the error correction capability of the RS decoder 47, the RS decoder 47 fails in error correction. Here, these errors include errors occurring in the stuffing byte section.

Information (or data) included in the stuffing byte section is not real information (or data) but is redundant information (or data). Accordingly, the errors occurring in the stuffing byte section are not real errors. Nonetheless, as a result, the error correction capability of the RS decoder 47 is reduced.

SUMMARY OF THE INVENTION

Exemplary embodiments of the present invention provide a decoding circuit and decoding method for improving error correction capability during Reed-Solomon decoding by analyzing a stuffing byte section in a RS-coded Moving Picture Experts Group (MPEG) packet, and a recording medium for recording the decoding method.

According to an exemplary embodiment of the present invention, there is provided a decoding circuit for decoding an input data packet including at least one stuffing byte having a stuffing byte level value. The decoding circuit includes a first decoder and a control block. The first decoder receives and decodes the input data packet to output a first data packet and outputs a flag indicating whether error correction of the input data packet is possible based on a decoding result. The control block selectively outputs one packet between the first data packet and a second data packet based on a logic level of the flag. The control block detects a stuffing byte section in the input data packet based on the logic level of the flag, converts a level value of at least one data in the stuffing byte section into the stuffing byte level value, and decodes a data packet having the converted level value to output the second data packet.

The control block may include a stuffing byte detection/conversion block, a second decoder, and a selector. Based on the logic level of the flag, the stuffing byte detection/conversion block detects the stuffing byte section in the input data packet, converts the level value of the at least one data in the stuffing byte section into the stuffing byte level value, and outputs the data packet having the converted level value. Based on the logic level of the flag, the second decoder receives and decodes the data packet having the converted level value, which is output from the stuffing byte detection/conversion block, and outputs the second data packet. Based on the logic level of the flag, the selector selectively outputs one packet between the first data packet output from the first decoder and the second data packet output from the second decoder.

The first decoder may output the flag at a first logic level when it fails in the error correction of the input data packet and the stuffing byte detection/conversion block and the second decoder may be enabled in response to the first logic level of the flag. The selector may output the second data packet output from the second decoder in response to the first logic level of the flag.

The stuffing byte detection/conversion block may include a stuffing byte detection block detecting the stuffing byte section and a stuffing byte conversion block converting the level value of the at least one data in the stuffing byte section into the stuffing byte level value based on a detection result. The stuffing byte detection block sets a plurality of different windows at the input data packet, sequentially calculates the number of data having the stuffing byte level value in the individual windows, sets a window having the calculated number of data greater than a first reference value for the first time among the windows as a first window, sets a window having the calculated number of data smaller than a second reference value for the first time among the windows as a second window, and sets a section from the first window to the second window as the stuffing byte section.

The input data packet may be a Reed-Solomon encoded data packet, and each of the first and second decoders may be a Reed-Solomon decoder.

According to an exemplary embodiment of the present invention, there is provided a decoding circuit for decoding a first data packet including at least one stuffing byte having a stuffing byte level value. The decoding circuit includes a control block and a decoder. The control block receives the first data packet and outputs a second data packet. The decoder receives and decodes the second data packet, outputs a decoded second data packet, and outputs a flag indicating whether error correction of the second data packet is possible based on a decoding result. Based on the flag, the control block outputs the first data packet as the second data packet or detects a stuffing byte section in the first data packet, converts a level value of at least one data in the stuffing byte section into the stuffing byte level value, and outputs a data packet having the converted level value as the second data packet.

The control block may include an input buffer, a stuffing byte detection/conversion block, and a selector. The input buffer receives and stores the first data packet and outputs the first data packet based on the flag. Based on the flag, the stuffing byte detection/conversion block receives the first data packet output from the input buffer, detects the stuffing byte section in the first data packet, and converts the level value of the at least one data in the stuffing byte section into the stuffing byte level value. Based on the flag, the selector outputs one packet between the first data packet and the data packet having the converted level value, which is output from the stuffing byte detection/conversion block, as the second data packet.

The decoder may output the flag at a first logic level when it fails in the error correction of the second data packet. The input buffer may output the first data packet in response to the first logic level of the flag. The stuffing byte detection/conversion block may be enabled in response to the first logic level of the flag. The selector may selectively output the data packet having the converted level value, which is output from the stuffing byte detection/conversion block, in response to the first logic level of the flag.

The stuffing byte detection/conversion block may include a stuffing byte detection block and a stuffing byte conversion block. The stuffing byte detection block detects the stuffing byte section. The stuffing byte conversion block converts the level value of the at least one data in the stuffing byte section into the stuffing byte level value based on a detection result. Here, the stuffing byte detection block sets a plurality of different windows at the first data packet, sequentially calculates the number of data having the stuffing byte level value in the individual windows, sets a window having the calculated number of data greater than a first reference value for the first time among the windows as a first window, sets a window having the calculated number of data smaller than a second reference value for the first time among the windows as a second window, and sets a section from the first window to the second window as the stuffing byte section.

According to an exemplary embodiment of the present invention, there is provided a terrestrial digital multimedia broadcasting receiver for receiving a data packet including at least one stuffing byte. The terrestrial digital multimedia broadcasting receiver includes a demodulator demodulating the data packet and outputting a demodulated data packet, a Viterbi decoder decoding the demodulated data packet output from the demodulator and outputting a decoded data packet, a deinterleaver deinterleaving the decoded data packet output from the Viterbi decoder and outputting a deinterleaved data packet, and a decoding block decoding the deinterleaved data packet output from the deinterleaver. The decoding block includes a first decoder and a control block. The first decoder decodes the deinterleaved data packet to output a first data packet and outputs a flag indicating whether error correction of the deinterleaved data packet is possible based on a decoding result. The control block selectively outputs one packet between the first data packet and a second data packet based on the flag. Here, the control block detects a stuffing byte section in the deinterleaved data packet based on the flag, converts a level value of data in the stuffing byte section into a stuffing byte level value, and decodes a data packet having the converted level value to output the second data packet.

According to an exemplary embodiment of the present invention, there is provided a terrestrial digital multimedia broadcasting receiver for receiving a data packet including at least one stuffing byte. The terrestrial digital multimedia broadcasting receiver includes a demodulator demodulating the data packet and outputting a demodulated data packet, a Viterbi decoder decoding the demodulated data packet output from the demodulator and outputting a decoded data packet, a deinterleaver deinterleaving the decoded data packet output from the Viterbi decoder to output a first data packet, and a decoding block decoding the first data packet output from the deinterleaver. The decoding block includes a control block and a decoder. The control block receives the first data packet and outputs a second data packet. The decoder receives and decodes the second data packet, outputs a decoded second data packet, and outputs a flag indicating whether error correction of the second data packet is possible based on a decoding result. Based on the flag, the control block outputs the first data packet as the second data packet or detects a stuffing byte section in the first data packet, converts a level value of data in the stuffing byte section into the stuffing byte level value, and outputs a data packet having the converted level value as the second data packet.

The control block may include an input buffer, a stuffing byte detection/conversion block, and a selector. The input buffer receives and stores the first data packet and outputs the first data packet based on the flag. Based on the flag, the stuffing byte detection/conversion block detects the stuffing byte section in the first data packet output from the input buffer and converts the level value of the data in the stuffing byte section into the stuffing byte level value. Based on the flag, the selector outputs one packet between the first data packet and the data packet having the converted level value, which is output from the stuffing byte detection/conversion block, as the second data packet.

According to an exemplary embodiment of the present invention, there is provided a method of decoding an input data packet including at least one stuffing byte having a stuffing byte level value. The method includes receiving and decoding the input data packet to output a first data packet, outputting a flag indicating whether error correction of the input data packet is possible based on a decoding result, detecting a stuffing byte section in the input data packet based on the flag, converting a level value of data in the stuffing byte section into the stuffing byte level value based on the flag, decoding a data packet having the converted level value to output a second data packet based on the flag, and selecting and outputting one packet between the first data packet and the second data packet based on the flag.

The detecting of the stuffing byte section may include setting a plurality of different windows at the input data packet and sequentially calculating the number of data having the stuffing byte level value in the individual windows; setting a window having the calculated number of data greater than a first reference value for the first time among the windows as a first window and setting a window having the calculated number of data smaller than a second reference value for the first time among the windows as a second window; and setting a section from the first window to the second window as the stuffing byte section.

The outputting of the flag may include outputting the flag at a first logic level when the error correction of the input data packet fails. Here, the detecting of the stuffing byte section, the converting of the level value of the data, and the decoding of the data packet having the converted level value are performed in response to the first logic level of the flag. The input data packet may be a Reed-Solomon encoded data packet and the decoding may be Reed-Solomon decoding.

According to an exemplary embodiment of the present invention, there is provided a recording medium for recording a program for performing the above-described method.

BRIEF DESCRIPTION OF THE DRAWINGS

Exemplary embodiments of the present invention will be understood in more detail from the following detailed descriptions taken in conjunction with the attached drawings in which.

DETAILED DESCRIPTION OF EXEMPLARY EMBODIMENTS

Figure 1:
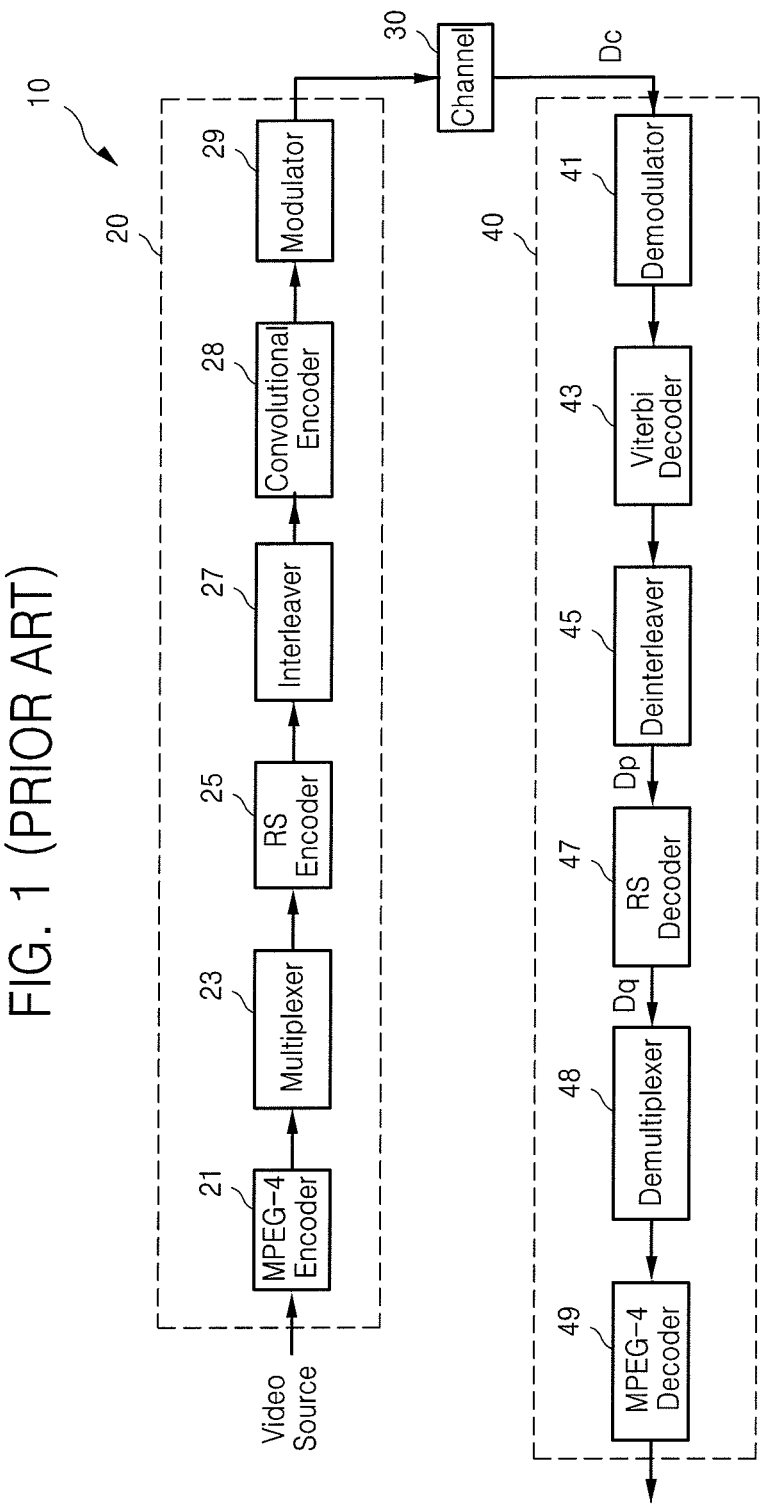
FIG. 1 illustrates a block diagram of a conventional terrestrial digital multimedia broadcasting (T-DMB) system.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

Figure 4:
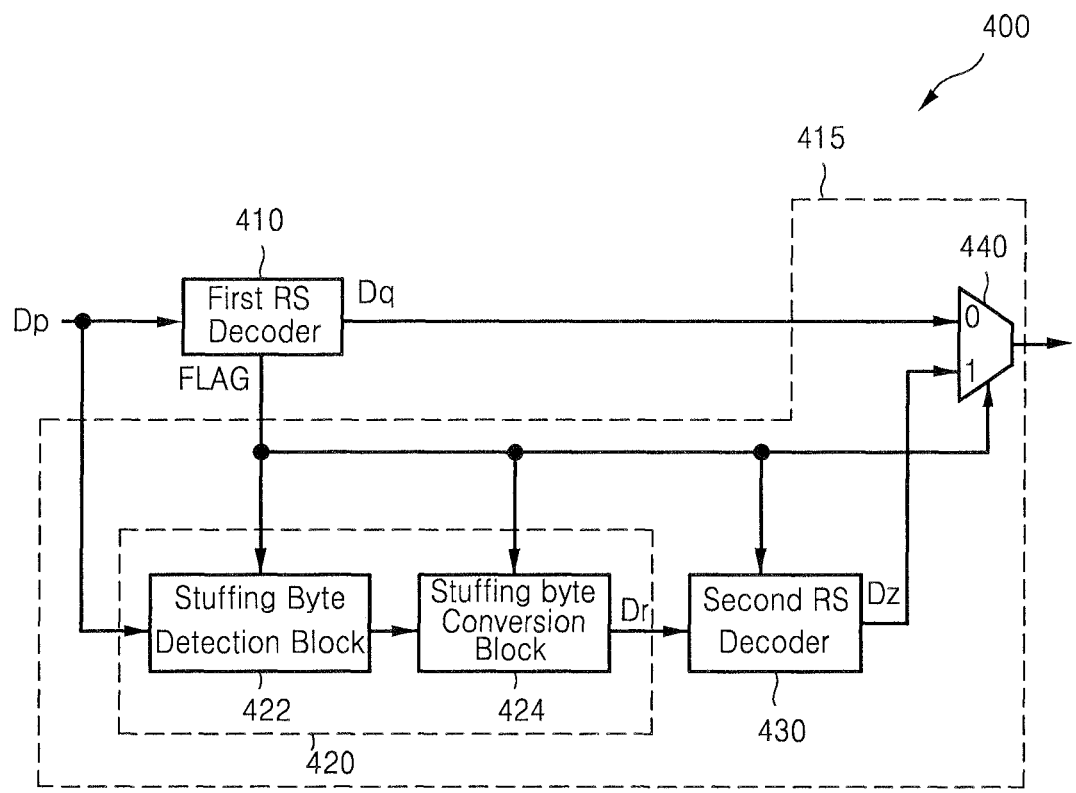
FIG. 4 illustrates an RS decoding circuit according to an exemplary embodiment of the present invention.

FIG. 4 illustrates a Reed-Solomon (RS) decoding circuit according to an exemplary embodiment of the present invention. The RS decoding circuit 400 includes a first RS decoder 410 and a control block 415.

The first RS decoder 410 receives and decodes a data packet Dp and outputs a decoded data packet Dq. The first RS decoder 410 also outputs a flag FLAG indicating the possibility of error correction of the data packet Dp based on a decoding result. The data packet Dp is an RS codeword resulting from encoding performed by an RS encoder.

In other words, the first RS decoder 410 receives and decodes the RS codeword Dp and outputs the decoded data packet Dq. When it is determined that error correction is impossible based on the decoding result, the first RS decoder 410 outputs the flag FLAG at a first logic level, for example, a high logic level ("1").

Figure 2:
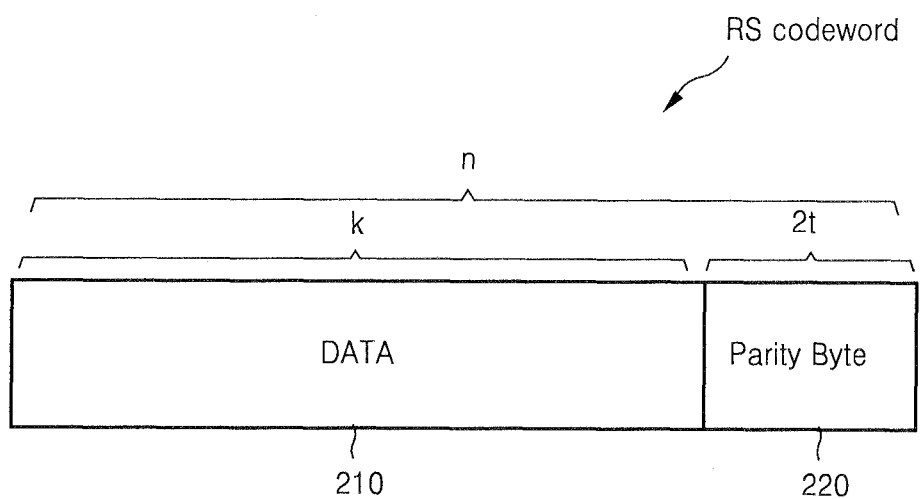
FIG. 2 illustrates a conventional Reed-Solomon (RS) codeword.
Figure 3A:
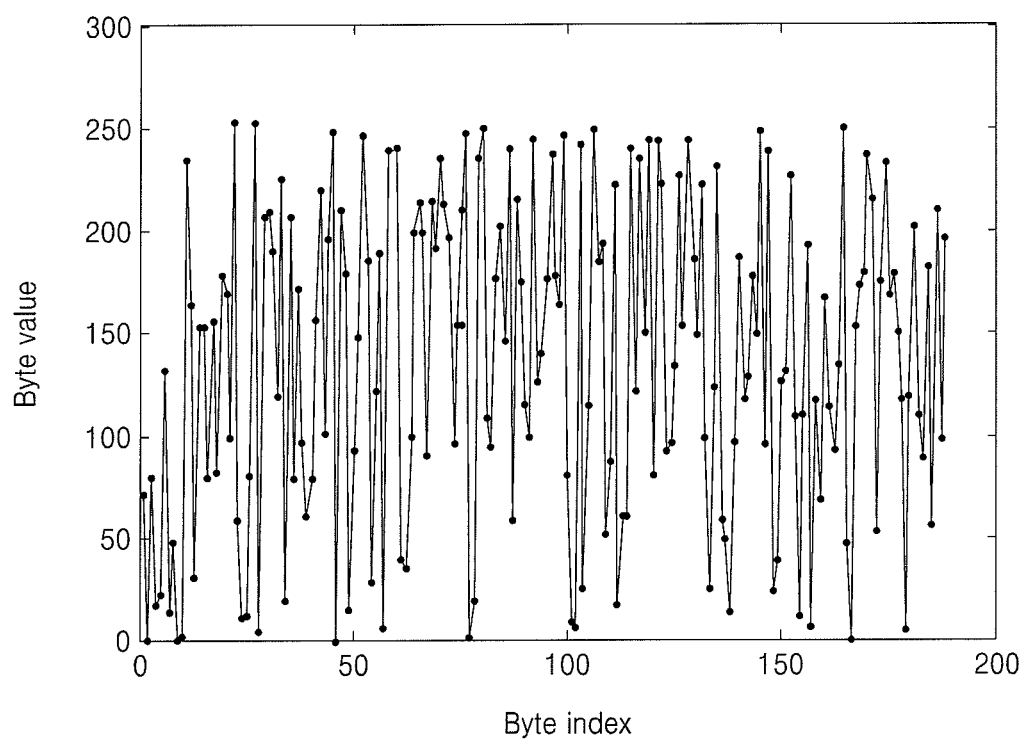
FIG. 3A illustrates an example of a Moving Picture Experts Group (MPEG) packet that does not include stuffing bytes.
Figure 3B:
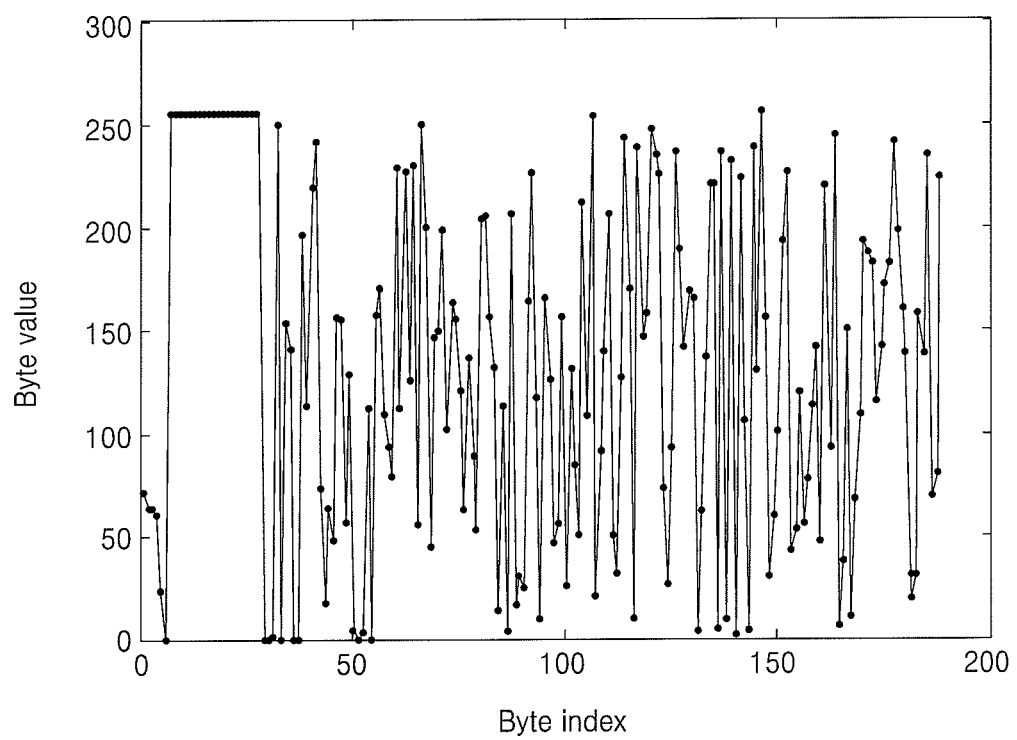
FIGS. 3B and 3C illustrate examples of an MPEG packet including stuffing bytes.
Figure 3C:
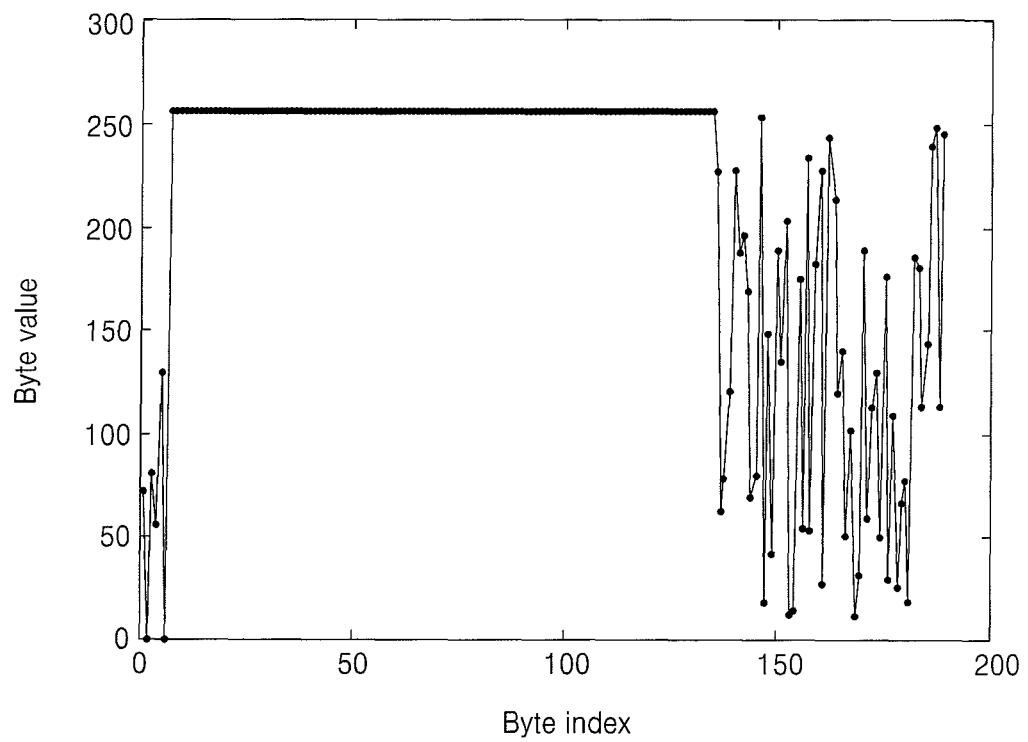

For example, the first RS decoder 410 can correct a maximum of 8 error bytes with respect to the RS codeword (for example, n=204, k=188, t=8) illustrated in FIG. 2. When errors detected by the first RS decoder 410 exceed 8 bytes (for example, when 10 error bytes are detected), however, the first RS decoder 410 fails in error correction. Accordingly, the first RS decoder 410 outputs the flag FLAG at the first logic level ("1"). As is illustrated in FIG. 2, "n" is the length of the RS codeword, "k" is the length of data in the RS codeword, and the RS codeword has 2 t (=n−k) parity bytes.

The control block 415 selectively outputs the first data packet Dq decoded by the first RS decoder 410 or a second data packet Dz decoded by a second RS decoder 430 based on the logic level of the flag FLAG. In other words, the control block 415 detects a stuffing byte section in the data packet Dp based on the logic level of the flag FLAG, converts a level value of at least one data in the detected stuffing byte section into a stuffing byte level value, for example, 0x0FF, decodes a data packet Dr having the converted level value, for example, 0x0FF, and outputs the second data packet Dz.

The control block 415 includes a stuffing byte detection/conversion block 420, a second RS decoder 430, and a selector 440.

The stuffing byte detection/conversion block 420 detects the stuffing byte section in the data packet Dp based on the logic level of the flag FLAG, converts a level value of data in the detected stuffing byte section into a stuffing byte level value, for example, 0x0FF, and outputs the data packet Dr having the converted level value.

The stuffing byte detection/conversion block 420 includes a stuffing byte detection block 422 and a stuffing byte conversion block 424. The stuffing byte detection block 422 is enabled in response to the first logic level, for example, the high logic level ("1"), of the flag FLAG. The stuffing byte detection block 422 detects the stuffing byte section in the data packet Dp in response to the first logic level ("1") of the flag FLAG. Here, the stuffing byte section indicates a section in which stuffing bytes exist in the data packet Dp.

The stuffing byte detection block 422 sets a plurality of windows in the data packet Dp and a length of each of the windows may be set to N bytes, where N is a natural number, for example, 6. The stuffing byte detection block 422 sequentially calculates the number of data, for example, in units of bytes, having the stuffing byte level value, for example, a hexadecimal format of 0x0FF or a binary number 11111111, with respect to each of the windows.

The number of data having the stuffing byte level value may be calculated in units of bytes or bits. For example, the stuffing byte detection block 422 may calculate the number of bits having the first logic level, for example, the high logic level ("1") in a window having a length of 6 bytes (=48 bits).

When the number of data having the stuffing byte level value, for example, 11111111, which is the number of bits having the first logic level, in a window among all of the windows is initially greater than a first reference value T1 such as 42 bits, the stuffing byte detection block 422 sets the window as a first window. The first window is a start position P1 of the stuffing byte section. When the number of data having the stuffing byte level value, for example, the number of bits having the first logic level, in a window among all of the windows is initially smaller than a second reference value T2 such as 30 bits, the stuffing byte detection block 422 sets the window as a second window. The second window is an end position P2 of the stuffing byte section.

The stuffing byte detection block 422 sets a section from the start position P1 to the end position P2 as the stuffing byte section.

When the length of each window is set very small, the reliability of the stuffing byte detection is low. Accordingly, the length of each window, the first reference value T1, and the second reference value T2 may be appropriately adjusted in consideration of the desired reliability of stuffing byte detection.

The stuffing byte conversion block 424 converts a level value of at least one data in the detected stuffing byte section into a stuffing byte level value, for example, 0x0FF, and outputs the data packet Dr having the converted level value. Accordingly, a value of error data, for example, a value other than the stuffing byte level value 0x0FF, in the stuffing byte section is converted into the stuffing byte level value 0x0FF.

The second RS decoder 430 receives the data packet Dr having the converted level value from the stuffing byte conversion block 424 and decodes the data packet Dr, in response to the first logic level ("1") of the flag FLAG.

The data packet Dr having the converted level value corresponds to the data packet Dp from which errors in the stuffing byte section have been removed by the stuffing byte detection/conversion block 420. Accordingly, the RS decoding circuit 400 has an improved error correction capability with respect to the data packet Dp. For example, when two error bytes exist in a stuffing byte section detected in the RS codeword, for example, n=204, k=188, t=8, illustrated in FIG. 2, since the first RS decoder 410 can correct a maximum of 8 error bytes with respect to the RS codeword, the RS decoding circuit 400 can correct a maximum of 10 error bytes with respect to the RS codeword.

The selector 440 selects and outputs one data packet between the decoded data packet Dq output from the first RS decoder 410 and the decoded data packet Dz output from the second RS decoder 430 in response to the logic level of a selection signal, that is, the flag FLAG. The selector 440 may be implemented by a multiplexer, but the present invention is not restricted to that exemplary embodiment.

When it is determined that the error correction is impossible based on a result of decoding the RS codeword Dp, the first RS decoder 410 outputs the flag FLAG at the first logic level, for example, the high logic level ("1"). When it is determined that the error correction is possible, the first RS decoder 410 outputs the flag FLAG at a second logic level, a low logic level ("0").

The stuffing byte detection block 422, the stuffing byte conversion block 424, and the second RS decoder 430 are disabled in response to the second logic level ("0") of the flag FLAG.

Accordingly, the selector 440 selects and outputs the decoded data packet Dz from the second RS decoder 430 in response to the first logic level ("1") of the flag FLAG and selects and outputs the decoded data packet Dq from the first RS decoder 410 in response to the second logic level ("0") of the flag FLAG.

Figure 5:
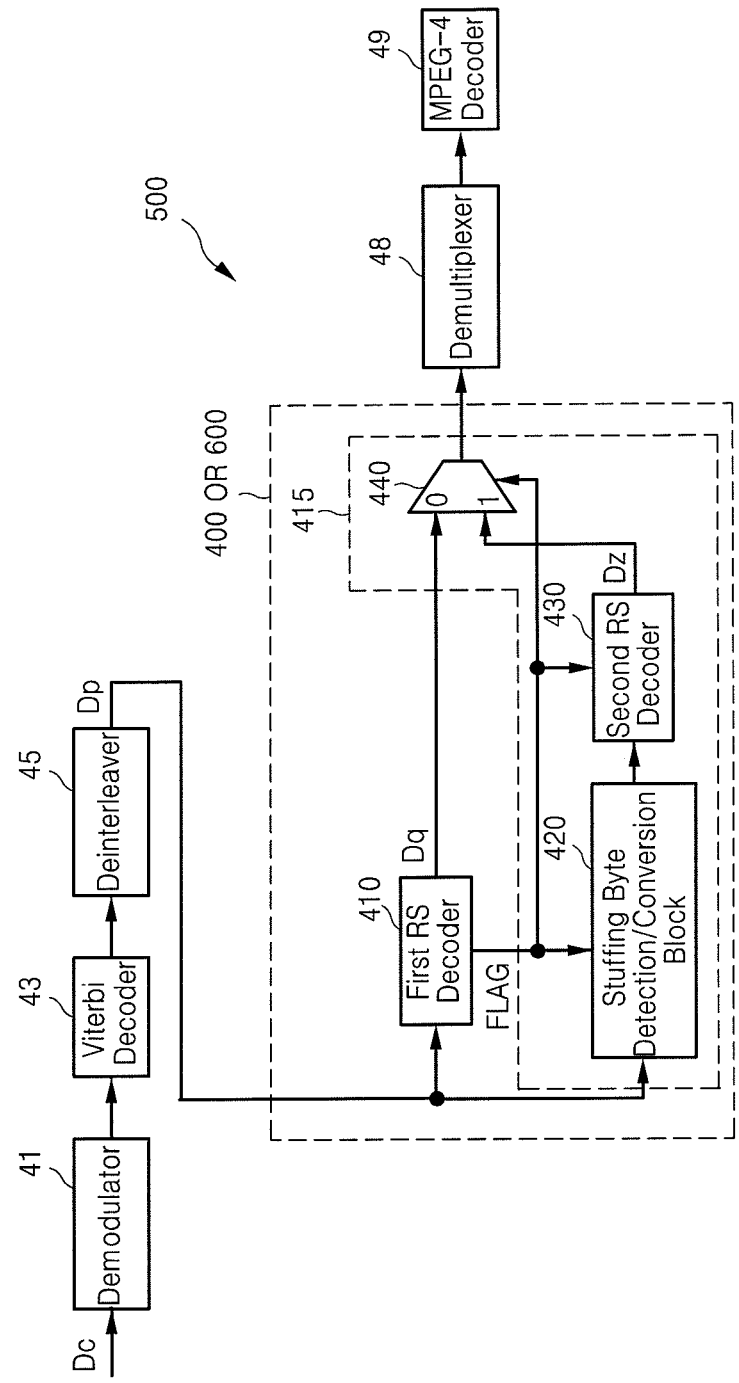
FIG. 5 illustrates a T-DMB receiver according to an exemplary embodiment of the present invention.

FIG. 5 illustrates a terrestrial digital multimedia broadcasting (T-DMB) receiver 500 according to an exemplary embodiment of the present invention. The T-DMB receiver 500 includes the demodulator 41, the Viterbi decoder 43, the deinterleaver 45, the RS decoding circuit 400 or 600, the demultiplexer 48, and the Moving Picture Experts Group standard 4(MPEG-4) decoder 49.

The RS decoding circuit 400, shown in FIG. 4, receives a deinterleaved data packet Dp from the deinterleaver 45, decodes the data packet Dp, and outputs a decoded data packet Dq or Dz to the demultiplexer 48 based on a decoding result. The functions of the elements 41, 43, 45, 400, 48, and 49 will be satisfactorily understood by those skilled in the art with reference to FIGS. 1 and 4. Thus, the detailed description thereof will be omitted.

Figure 6:
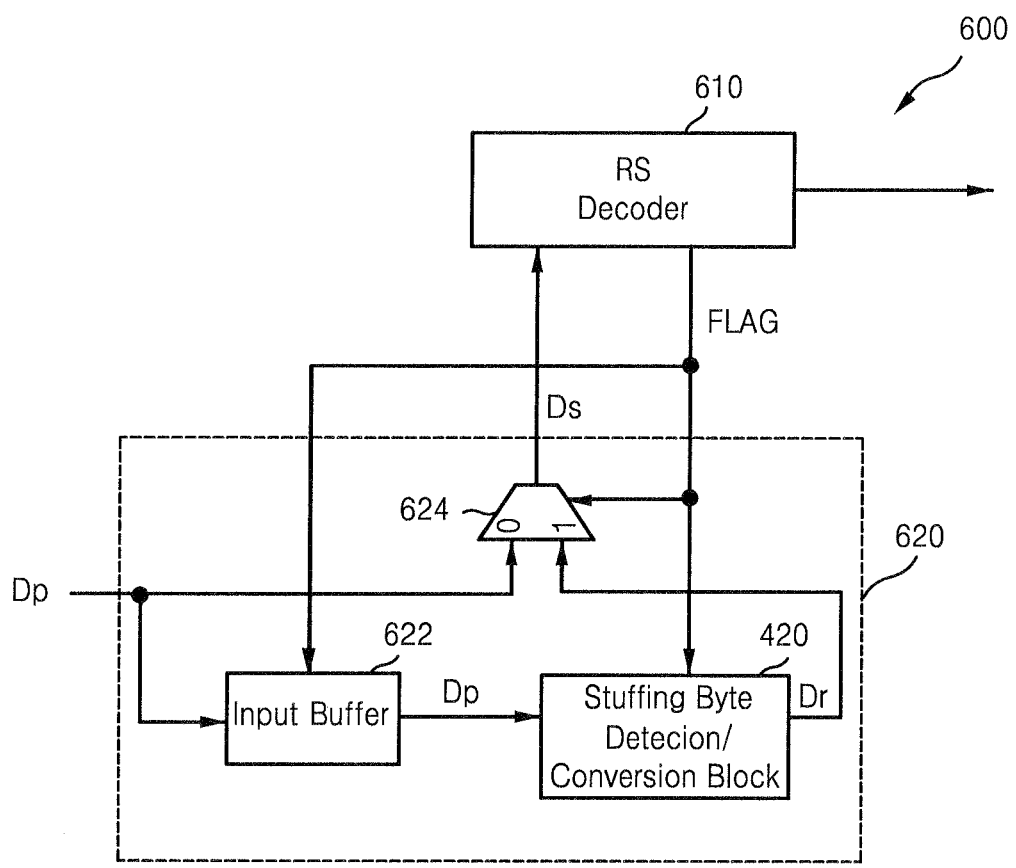
FIG. 6 illustrates an RS decoding circuit according to an exemplary embodiment of the present invention.

FIG. 6 illustrates an RS decoding circuit according to an exemplary embodiment of the present invention. The RS decoding circuit 600 includes an RS decoder 610 and a control block 620.

The RS decoder 610 decodes a second data packet Ds output from the control block 620 and outputs a flag FLAG based on a decoding result. When the RS decoder 610 fails in error correction of the second data packet Ds, the RS decoder 610 outputs the flag FLAG at a first logic level, for example, a high logic level ("1").

In response to the flag FLAG output from the RS decoder 610, the control block 620 outputs a first data packet Dp, that is, the interleaved data packet Dp received from the deinterleaver 45 or a converted first data packet Dr output from the stuffing byte detection/conversion block 420, as the second data packet Ds.

As described above with reference to FIG. 4, the stuffing byte detection/conversion block 420 detects a stuffing byte section in the first data packet Dp, converts a level value of at least one data in the stuffing byte section into a stuffing byte level value, for example, a hexadecimal value of 0x0FF, and outputs the converted first data packet Dr.

The control block 620 includes an input buffer 622, the stuffing byte detection/conversion block 420, and a selector 624. The input buffer 622 receives and stores the data packet Dp and outputs the stored data packet Dp to the stuffing byte detection/conversion block 420 in response to the first logic level ("1") of the flag FLAG.

When an error in the data packet Dp cannot be corrected by the RS decoder 610, the input buffer 622 outputs the data packet Dp to the stuffing byte detection/conversion block 420. The data packet Dp is an RS codeword resulting from the encoding performed by an RS encoder (not shown).

In response to the first logic level ("1") of the flag FLAG, the stuffing byte detection/conversion block 420 receives the data packet Dp output from the input buffer 622 and detects a stuffing byte section in the data packet Dp. Also, the stuffing byte detection/conversion block 420 converts a level value of at least one data in the stuffing byte section into a stuffing byte level value, for example, 0x0FF, and outputs the data packet Dr having the converted level value, in response to the first logic level ("1") of the flag FLAG.

In response to the first logic level ("1") of the flag FLAG, the selector 624 outputs the data packet Dr received from the stuffing byte detection/conversion block 420 to the RS decoder 610.

The selector 624 outputs the converted data packet Dr to the RS decoder 610 in response to the first logic level ("1") of the flag FLAG and outputs the first data packet Dp to the RS decoder 610 in response to a second logic level, for example, a low logic level ("0"), of the flag FLAG.

Unlike the RS decoding circuit 400 illustrated in FIG. 4, the RS decoding circuit 600 illustrated in FIG. 6 is an example of a decoding circuit having a time sharing structure using a single RS decoder 610. The RS decoding circuit 400 included in the T-DMB receiver 500 illustrated in FIG. 5 may be replaced with the RS decoding circuit 600 illustrated in FIG. 6.

Figure 7:
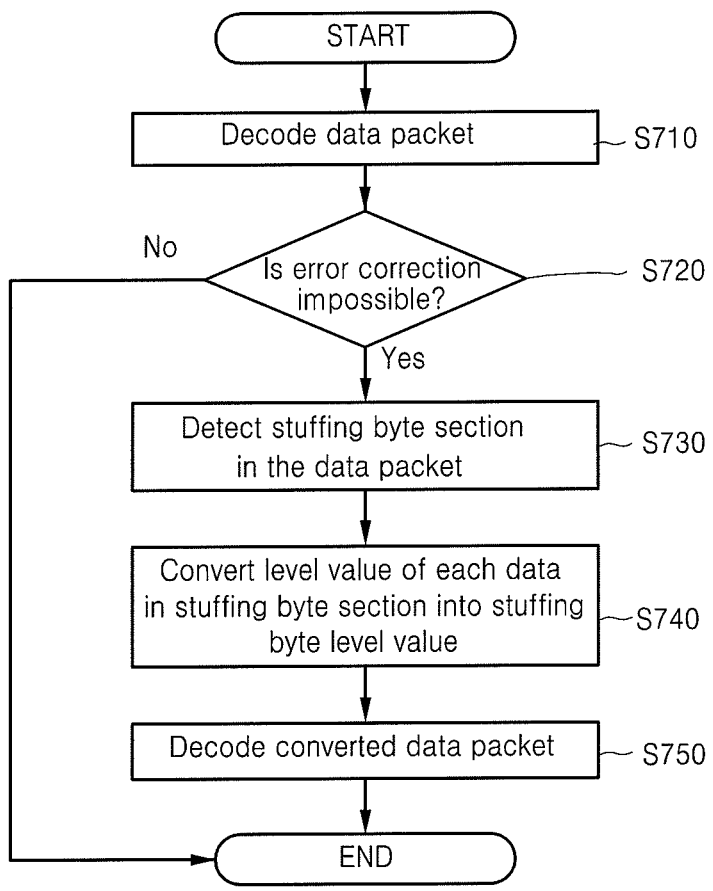
FIG. 7 is a flowchart of a decoding method according to an exemplary embodiment of the present invention.

FIG. 7 is a flowchart of a decoding method according to an exemplary embodiment of the present invention. Referring to FIGS. 4 and 7, the first RS decoder 410 decodes a data packet Dp in operation S710.

In operation S720, the first RS decoder 410 determines whether error correction of the data packet Dp is possible based on a decoding result. When it is determined that the error correction of the data packet Dp is impossible (No), the first RS decoder 410 outputs the flag FLAG at the first logic level ("1"). When it is determined that the error correction of the data packet Dp is possible (Yes), the first RS decoder 410 outputs the flag FLAG at the second logic level ("0").

In operation S730, the stuffing byte detection block 422 of the control block 415 detects a stuffing byte section in the data packet Dp in response to the first logic level ("1") of the flag FLAG. In operation S740, the stuffing byte conversion block 424 of the control block 415 converts a level value of each data in the stuffing byte section into a stuffing byte level value. In operation S750, the second RS decoder 430 receives a converted data packet Dr from the stuffing byte conversion block 424, decodes the data packet Dr, and outputs a decoded data packet Dz.

Hereinafter, a decoding method performed by the RS decoding circuit 600 illustrated in FIG. 6 will be described. Referring to FIGS. 6 and 7, when it is assumed that the RS decoder 610 initially outputs the flag FLAG at the second logic level ("0") (No), the RS decoder 610 decodes a first data packet Ds (=Dp) received via the selector 624 in operation S710.

In operation S720, the RS decoder 610 determines whether error correction of the first data packet Dp is possible (No) based on a decoding result. When it is determined that the error correction of the first data packet Dp is impossible (Yes), the first RS decoder 610 outputs the flag FLAG at the first logic level ("1"). The control block 620 outputs a data packet Dr received from the stuffing byte detection/conversion block 420 as a second data packet Ds.

More specifically, in operation S730, the control block 620 detects a stuffing byte section in the first data packet Dp output from the input buffer 622 in response to the first logic level ("1") of the flag FLAG.

In operation S740, the control block 620 converts a level value of each data in the stuffing byte section into a stuffing byte level value, for example, 0x0FF, and generates a data packet Dr having the converted level value. The control block 620 outputs the data packet Dr having the converted level value as a second data packet Ds in response to the first logic level ("1") of the flag FLAG. In operation S750, the RS decoder 610 decodes the second data packet Ds (=Dr) and outputs a decoded data packet.

Figure 8:
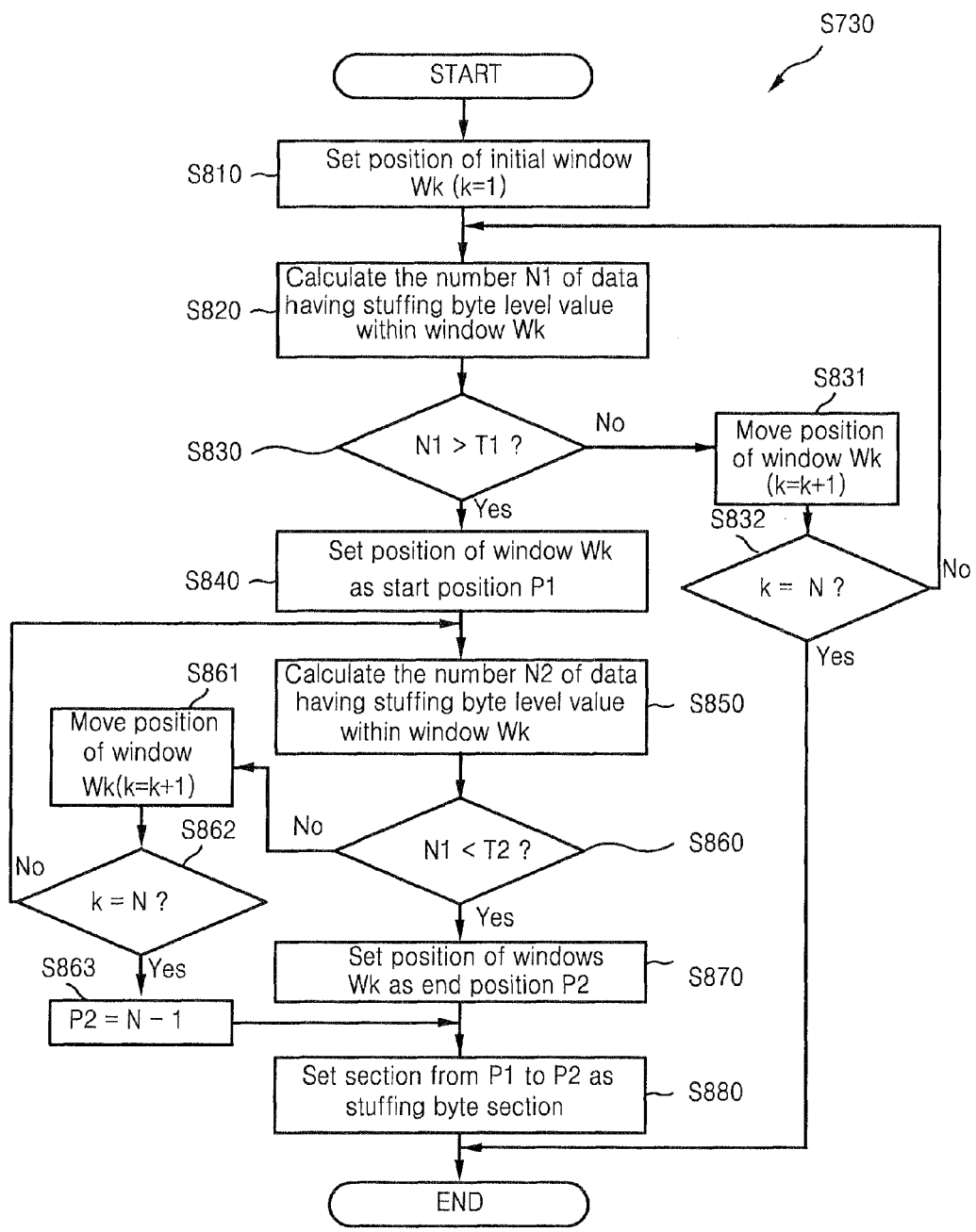
FIG. 8 is a detailed flowchart of the operation of detecting a stuffing byte section illustrated in FIG. 7.

FIG. 8 is a detailed flowchart of the operation S730 of detecting a stuffing byte section illustrated in FIG. 7. Referring to FIGS. 4 and 8, the stuffing byte detection block 422 sets a position of an initial window (Wk) at a data packet Dp in operation S810. Here, the stuffing byte detection block 422 sets a plurality of windows W1 through WN (N is a natural number) having different sections at the data packet Dp and sets the position of an initial window Wk ($k=1, 1 \leq k \leq N$). The length of each of the windows W1 through WN may be M bytes, where M is a natural number.

In operation S820, the stuffing byte detection block 422 calculates the number N1 of data having a stuffing byte level value, for example, 0x0FF or 11111111, within the window Wk (k=1). In operation S830, the stuffing byte detection block 422 compares the calculated number N1 with a first reference value T1. When the number N1 is not greater than the first reference value T1, that is, $N1 \leq T1$, the stuffing byte detection block 422 moves the position of the window Wk like k=k+1 in operation S831 and determines whether the moved position of the window Wk (k=2) is a position of the last window Wk (k=N) set at the data packet Dp in operation S832.

When the moved position of the window Wk (k=2) is not the position of the last window Wk (k=N), the stuffing byte detection block 422 repeats operations S820, S830, and S831.

When the moved position of the window Wk (k=2) is the position of the last window Wk (k=N), the stuffing byte detection block 422 terminates the detection of the stuffing byte section.

When the number N1 is greater than the first reference value T1, that is, N1>T1 in operation S830, the stuffing byte detection block 422 sets a position of a window Wk, in which N1>T1 for the first time, as a start position P1 of the stuffing byte section in operation S840. That is, when the condition N1>T1 is met, the stuffing byte detection block 422 sets the starting position of the stuffing byte section to the current value of k.

In operation S850, the stuffing byte detection block 422 calculates the number N2 of data having the stuffing byte level value within a window Wk next to the window Wk at the start position P1. In operation S860, the stuffing byte detection block 422 compares the number N2 with a second reference value T2. When the number N2 is smaller than the second reference value T2, that is, N2<T2, the stuffing byte detection block 422 sets the position of the window Wk as an end position P2 of the stuffing byte section in operation S870. When the condition N2<T2 is met the stuffing byte detection block 422 sets ending position of the stuffing section to the current value of k.

When the number N2 is not smaller than the second reference value T2, that is, N2≧T2, however, the stuffing byte detection block 422 moves the position of the window Wk to a position of a next window Wk in operation S861 and determines whether the position of the window Wk is a position of the last window Wk (k=N) in operation S862.

When the position of the window Wk is not the position of the last window Wk (k=N), the stuffing byte detection block 422 repeats operations S850, S860, and S861.

When the position of the window Wk is the position of the last window Wk (k=N) in operation S860, the stuffing byte detection block 422 sets a position of a window Wk (k=N−1) preceding the last window Wk (k=N) as the end position P2 of the stuffing byte section in operation S863.

In operation S880, the stuffing byte detection block 422 sets a section from the start position P1 to the end position P2 as the stuffing byte section.

The decoding method described with reference to FIGS. 7 and 8 can also be embodied as computer readable codes on a computer readable recording medium. The computer readable recording medium is any data storage device that can store data that can thereafter be read by a computer system. Also, functional programs, codes, and code segments for accomplishing the exemplary embodiments of the present invention can be easily construed by programmers skilled in the art to which the present invention pertains.

As described above, according to exemplary embodiments of the present invention, a stuffing byte included in a data packet is used when the data packet is decoded, whereby the error correction capability of the data packet is increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A decoding circuit for decoding a first data packet including at least one stuffing byte having a stuffing byte level value, the decoding circuit comprising:
a control block receiving the first data packet and outputting a second data packet; and
a decoder receiving and decoding the second data packet, outputting a decoded second data packet, and outputting a flag indicating whether error correction of the second data packet is possible based on a result of the decoding,
wherein the control block outputs the first data packet as the second data packet or detects a stuffing byte section in the first data packet, converts a level value of at least one data in the stuffing byte section into the stuffing byte level value, and outputs a data packet having the converted level value as the second data packet, based on the flag.

2. The decoding circuit of claim 1, wherein the control block comprises:
an input buffer receiving and storing the first data packet and outputting the first data packet based on the flag;
a stuffing byte detection/conversion block receiving the first data packet output from the input buffer, detecting the stuffing byte section in the first data packet, and converting the level value of the at least one data in the stuffing byte section into the stuffing byte level value, based on the flag; and
a selector outputting one packet between the first data packet and the data packet having the converted level value, which is output from the stuffing byte detection/conversion block, as the second data packet based on the flag.

3. The decoding circuit of claim 2, wherein the decoder outputs the flag at a first logic level when the decoder fails in the error correction of the second data packet,
the input buffer outputs the first data packet in response to the first logic level of the flag,
the stuffing byte detection/conversion block is enabled in response to the first logic level of the flag, and
the selector selectively outputs the data packet having the converted level value, which is output from the stuffing byte detection/conversion block, in response to the first logic level of the flag.

4. The decoding circuit of claim 3, wherein the stuffing byte detection/conversion block comprises:
a stuffing byte detection block detecting the stuffing byte section; and
a stuffing byte conversion block converting the level value of the at least one data in the stuffing byte section into the stuffing byte level value based on a detection result, and
the stuffing byte detection block sets a plurality of different windows at the first data packet, sequentially calculates the number of data having the stuffing byte level value in the individual windows, sets a window having the calculated number of data greater than a first reference value for a first time among the windows as a first window, sets a window having the calculated number of data smaller than a second reference value for a first time among the windows as a second window, and sets a section from the first window to the second window as the stuffing byte section.

5. The decoding circuit of claim 4, wherein the first data packet is a Reed-Solomon encoded data packet, and the decoder is a Reed-Solomon decoder.

6. A terrestrial digital multimedia broadcasting receiver for receiving a data packet including at least one stuffing byte, the terrestrial digital multimedia broadcasting receiver comprising:
a demodulator demodulating the data packet and outputting a demodulated data packet;
a Viterbi decoder decoding the demodulated data packet output from the demodulator and outputting a decoded data packet;
a deinterleaver deinterleaving the decoded data packet output from the Viterbi decoder to output a first data packet; and
a decoder decoding the first data packet output from the deinterleaver,
wherein the decoder includes:
a control block receiving the first data packet and outputting a second data packet; and a decoder receiving and decoding the second data packet, outputting a decoded second data packet, and outputting a flag indicating whether error correction of the second data packet is possible based on a result of the decoding, and the control block outputs the first data packet as the second data packet or detects a stuffing byte section in the first data packet, converts a level value of data in the stuffing byte section into the stuffing byte level value, and outputs a data packet having the converted level value as the second data packet, based on the flag.

7. The terrestrial digital multimedia broadcasting receiver of claim 6, wherein the control block comprises:

an input buffer receiving and storing the first data packet and outputting the first data packet based on the flag;

a stuffing byte detection/conversion block detecting the stuffing byte section in the first data packet output from the input buffer and converting the level value of the data in the stuffing byte section into the stuffing byte level value, based on the flag; and a selector outputting one packet between the first data packet and the data packet having the converted level value, which is output from the stuffing byte detection/conversion block, as the second data packet based on the flag.

* * * * *